(12) United States Patent
Shirai et al.

(10) Patent No.: US 7,226,294 B2
(45) Date of Patent: Jun. 5, 2007

(54) ELECTRICAL CONNECTOR

(75) Inventors: Hiroshi Shirai, Saitama (JP); Shinichi Hashimoto, Kanagawa (JP)

(73) Assignee: Tyco Electronics AMP K.K, Kanagawa-Ken (JP)

( * ) Notice: Subject to any disclaimer, the term of this patent is extended or adjusted under 35 U.S.C. 154(b) by 0 days.

(21) Appl. No.: 11/218,877

(22) Filed: Sep. 2, 2005

(65) Prior Publication Data
US 2006/0003607 A1  Jan. 5, 2006

(30) Foreign Application Priority Data
Sep. 3, 2004  (JP) .............................. 2004-257774

(51) Int. Cl.
*H01R 12/00* (2006.01)
(52) U.S. Cl. ........................................................ 439/66
(58) Field of Classification Search ................ 439/66, 439/591
See application file for complete search history.

(56) References Cited

U.S. PATENT DOCUMENTS

| 5,230,632 | A | 7/1993 | Baumberger et al. |
| 5,248,262 | A | 9/1993 | Busacco et al. |
| 6,062,871 | A * | 5/2000 | Arai et al. ...................... 439/66 |
| 6,176,707 | B1 * | 1/2001 | Neidich et al. ............... 439/66 |
| 6,217,342 | B1 * | 4/2001 | Neidich et al. ............... 439/66 |
| 6,299,458 | B1 * | 10/2001 | Yamagami et al. ........... 439/66 |
| 6,315,576 | B1 * | 11/2001 | Neidich ......................... 439/66 |
| 6,345,987 | B1 * | 2/2002 | Mori et al. .................... 439/66 |
| 6,488,513 | B1 * | 12/2002 | Neidich et al. ............... 439/66 |
| 6,793,504 | B2 | 9/2004 | Noda et al. |

FOREIGN PATENT DOCUMENTS

JP         11-154545        9/1999

* cited by examiner

*Primary Examiner*—Gary F. Paumen
(74) *Attorney, Agent, or Firm*—Barley Snyder LLC

(57) ABSTRACT

The electrical connector of the present invention has an insulative housing having a first face across from a first electrical circuit and a second face across from a second electrical circuit. A plurality of contacts are mounted in the insulative housing, each of which contacts a contact point of the first electrical circuit at the first face, and contacts a contact point of the second electrical circuit at the second face, thereby interconnecting the first and second circuits. Each of the contacts has one portion of the contact supported by the insulative housing so as to be capable of pivoting in response to the displacement of the first contact portion and the second contact portion.

3 Claims, 7 Drawing Sheets

Figure 1
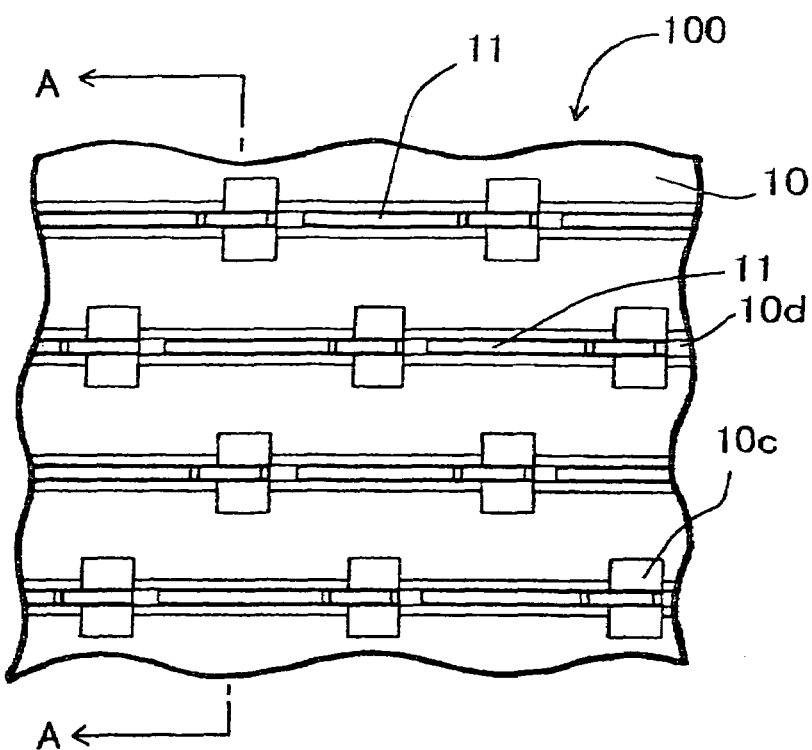
Figure 2a
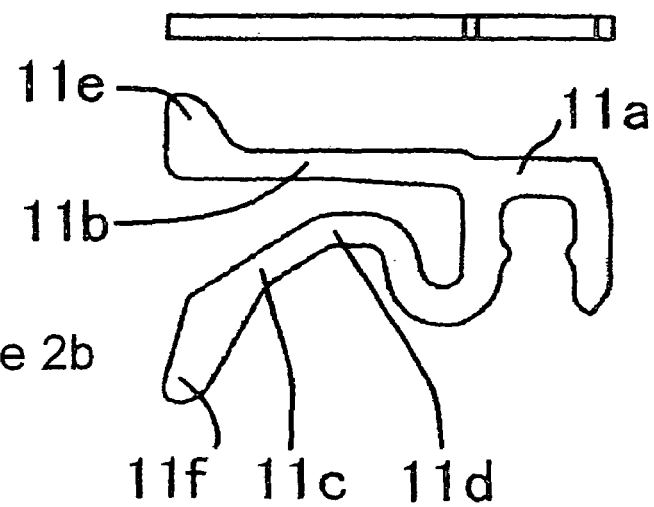
Figure 2b
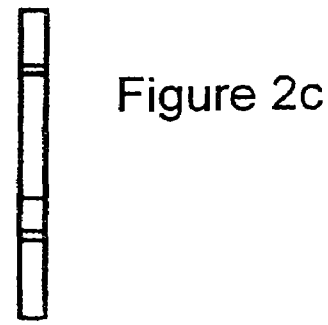
Figure 2c

ELECTRICAL CONNECTOR

FIELD OF THE INVENTION

The present invention relates to an electrical connector for connecting electrical circuits having a plurality of contact points, and more particularly relates to an electrical connector used for connecting LGA packages.

BACKGROUND

With a conventional Ball Grid Array (BGA) package, soldering is performed directly onto a circuit board in order to electrically connect an electrical circuit having a plurality of contact points arranged as an array such as an integrated circuit (IC) with another electrical circuit formed on a board. However, because the heat produced by soldering can have an adverse effect, and because this soldering makes replacement work more difficult, for example, Land Grid Array (LGA) packages have been used, in which connection to the circuit board is made via a socket-type electrical connector, rather than soldering directly to the board.

With the electrical connectors that are sandwiched between and electrically connect these LGA packages and circuit boards, a gap is produced between the contact points if there is any warping or the like of the circuit board on which the package is mounted, which is a problem in that it results in difficulty maintaining a reliable electrical connection. In order to provide an electrical connector capable of solving this problem, Japanese Laid-Open Patent Application H6-89764 states that a contact is constituted by disposing a flexible circuit member along with a spring means. Japanese Laid-Open Patent Application H5-226043 and Japanese Laid-Open Patent Application H11-154545 discuss the use of a contact that is C-shaped and a contact that is elastic and spiral-shaped, respectively. Japanese Laid-Open Patent Application 2000-231401 discusses the use of a springy, cantilevered contact.

However, when the contact discussed in H6-89764 is used, a positioning member has to be separately installed in order to hold the contact within the housing, and it is difficult to dispose the contacts at high density or to make the contacts shorter in height. When the contacts discussed in H5-226043 and H11-154545 are used, a lid has to be separately provided to the top of the housing in which the contact is held, making it difficult to reduce the height, and the shape of the contact itself is complicated, which makes molding more difficult. When the contact discussed in 2000-231401 is used, the contact has to be supported at at least two points of the housing, so the spacing at which the contacts are disposed cannot be reduced, and the work of mounting the contacts is also troublesome.

SUMMARY

The present invention was conceived in an effort to solve these problems, and it is an object thereof, among others, to provide an electrical connector with which the electrical connection between an LGA package and a circuit board can be reliably maintained even if there is warping in the circuit board or the like on which the package is to be mounted, and with which higher density and lower height can be achieved.

The electrical connector of the present invention has an insulative housing having a first face across from a first electrical circuit and a second face across from a second electrical circuit. A plurality of contacts are mounted in the insulative housing, each of which contacts a contact point of the first electrical circuit at the first face, and contacts a contact point of the second electrical circuit at the second face, thereby interconnecting the first and second circuits. Each of the contacts has one portion of the contact supported by the insulative housing so as to be capable of pivoting in response to the displacement of the first contact portion and the second contact portion. dr

BRIEF DESCRIPTION OF THE DRAWINGS

The invention will now be described with reference to the accompanying figures of which:

FIG. 1 is a plan view of the first embodiment of the electrical connector pertaining to the present invention;

FIGS. 2a–c illustrate the shape of the contacts mounted in the housing of the electrical connector shown in FIG. 1, wherein FIG. 2a is a plan view, FIG. 2b is a front view, and FIG. 2c is a right side view;

FIGS. 3a–b illustrate the contacts mounted in the housing of the electrical connector shown in FIG. 1, wherein FIG. 3a is a partial cross section in which the housing 10 has been cut in the middle along a contact holding groove 10d, and FIG. 3b is a partial cross section in which the housing 10 has been cut perpendicular to a contact holding groove 10d at the line A—A of FIG. 1;

FIGS. 4a–c shows an example of the overall structure of the electrical connector shown in FIG. 1, wherein FIG. 4a is a top view, FIG. 4b is a side view, and FIG. 4c is a bottom view;

FIGS. 6a–c illustrate the shape of the contacts mounted in the housing of the electrical connector shown in FIG. 5, wherein FIG. 6a is a plan view, FIG. 6b is a front view, and FIG. 6c is a right side view;

FIGS. 7a–b illustrate the contacts mounted in the housing of the electrical connector shown in FIG. 5, wherein FIG. 7a is a partial cross section in which the housing 20 has been cut in the middle along a contact holding groove 20d, and FIG. 7b is a partial cross section in which the housing 20 has been cut perpendicular to a contact holding groove 20d at the section line B—B of FIG. 5;

FIGS. 8a–c shows an example of the overall structure of the electrical connector shown in FIG. 5, wherein FIG. 8a is a top view, FIG. 8b is a side view, and FIG. 8c is a bottom view.

DETAILED DESCRIPTION OF THE EMBODIMENTS

Figure 3A:
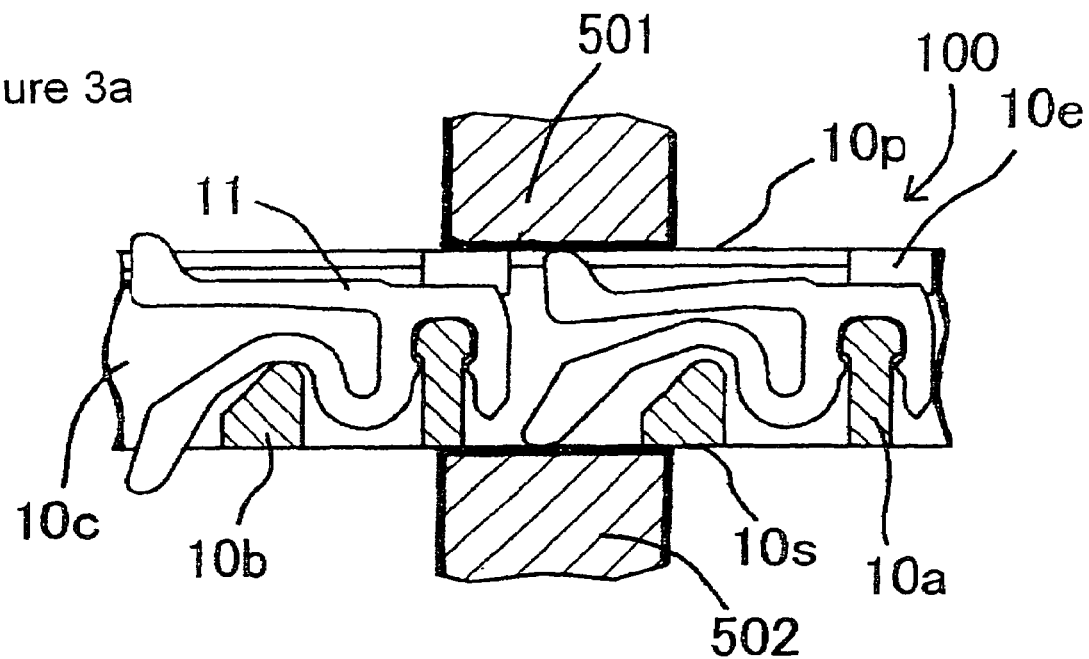

Embodiments of the electrical connector pertaining to the present invention will be described in greater detail through reference to the drawings. For the sake of convenience, the upper and lower directions in the drawings will be called just that: upper and lower. Portions that are common to the various embodiments are numbered the same.

FIG. 1 is a plan view of a state in which contacts 11 have been mounted in an insulative housing (hereinafter referred to simply as "housing") 10 of an electrical connector 100. Only part of the housing 10 is depicted. Contact holding grooves 10d for holding contacts 11 are formed on a first face (the upper face in FIG. 1) 10p of the housing 10, and the upper part of each contact holding groove 10d is formed with a V-shaped cross section for guiding the contacts 11 as needed. Contact support portions 10a (FIG. 3) for supporting the contacts 11 are provided at specific intervals. Contact cavities 10c (FIG. 3), in which are disposed the contact portions of the contacts 11, where the contact points of a first electrical circuit are electrically connected via the contacts 11 to the contact points of a second electrical circuit (neither of which are depicted) disposed respectively on the first face 10p and a second face (lower face) 10s of the housing 10, are formed in the upper and lower faces of the housing 10 at specific intervals. The rectangular recesses provided in the contact holding grooves 10d are contact insertion holes 10e that are used in the process of mounting the contacts 11 to the contact support portions 10a. This housing can be made of a synthetic resin having the required properties, for example.

Referring to FIGS. 2a–c, the contact 11 is a flat member having a support portion 11a that is supported by being fitted into the contact support portion 10a of the insulative housing 10, and two cantilevered beams 11b and 11c extending from the support portion 11a. The upper beam 11b and the lower beam 11c are formed integrally via the contact support portion 11a, and contact portions 11e and 11f formed at the distal ends thereof are in contact with a contact point 501 (FIG. 3a) of the first electrical circuit and a contact point 502 of the second electrical circuit, respectively, thereby electrically connecting these to each other. The two beams 11b and 11c of the contact 11 are designed to be able to undergo two-dimensional elastic deformation in which they move closer together or farther apart. This flat contact 11 can be formed, for example, by stamping a metal sheet with excellent elasticity and electrical conductivity, such as a copper alloy. The contact 11 may be plated or otherwise treated as needed.

Figure 3B:
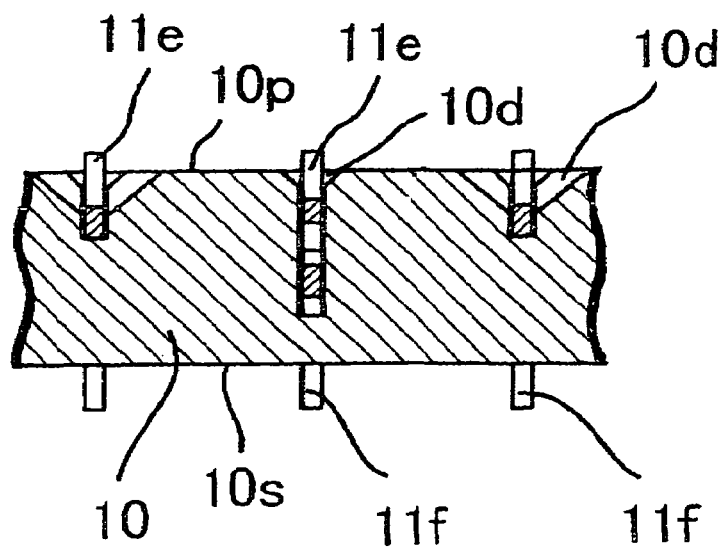

FIGS. 3a–b show the contacts 11 mounted in the housing 10. FIG. 3a is a partial cross section in which the housing 10 has been cut in the middle along a contact holding groove 10d, and FIG. 3b is a partial cross section in which the housing 10 has been cut perpendicular to a contact holding groove 10d at the section line A—A of FIG. 1.

The contacts 11 are designed so that they are supported by fitting just the contact support portions 11a thereof onto the contact support portions 10a of the insulative housing 10, and are able to pivot freely within the contact holding grooves 10d. The result is what is known as a floating structure, in which force applied to one of the contact portions 11e and 11f of a contact 11 is transmitted to the other contact portion. This means that when there is a relative change in the distance between the electrodes 501 and 502 of connected electrical circuits, there is less displacement of the beams 11b and 11c of the contacts 11 than with a non-floating structure in which the contact portions of a contact are displaced independently, and the contact portions 11e and 11f are constantly in contact with both of the electrodes 501 and 502, allowing the electrically connected state to be stably maintained. Employing a floating structure such as this is also advantageous because the dimensional tolerance of the contacts 11 can be controlled with just the distance between the two contact portions 11e and 11f.

When the contact portions 11e and 11f of the contacts 11 are pushed into the housing 10 while being sandwiched between the electrodes 501 and 502 of the electrical circuits disposed vertically in the housing, the contacts 11 elastically deform such that they move closer together around the contact support portions 11a. The contact 11 shown on the right side in FIG. 3a is in a state of having undergone elastic deformation while sandwiched between the electrodes 501 and 502.

Here, the reason the upper beam 11b of the contact 11 is straight whereas the lower beam 11c is curved is so that the force at which the contact portion 11e of the upper beam 11b comes into contact with the electrode 501 disposed on the upper face 10p of the housing 10 will be equalized with the force at which the distal end 11f of the lower beam 11c comes into contact with the electrode 502 disposed on the lower face 10s of the housing 10. Specifically, since it is assumed that greater warping will normally occur on the side of the circuit board on which the connector 100 is mounted, the amount that the contact portion 11f in contact with the contact point on the circuit board side protrudes from the lower face 10s of the housing 10 is set to be greater than the amount that the distal end 11e protrudes from the upper face 10p of the housing 10. Accordingly, it has been taken into account that the lower beam 11c has to be made longer than the upper beam 11b to reduce the spring constant. Furthermore, stops 10b provided inside the contact cavities 10c of the housing 10 are in contact with the curved portions 11d of the lower beams 11c and restrict movement such that the contact portions 11f do not protrude too far from the lower face 10s of the housing 10. These stops 10b do not affect the deformation behavior or the floating operation of the contacts 11.

Also, each contact 11 is disposed such that the position where the contact portion 11e comes into contact with the electrode 501 at the upper face 10p of the housing 10 overlaps the position where the contact portion 11f comes into contact with the electrode 502 at the lower face 10s of the housing 10, when viewed in the vertical direction. As a result, almost no rotational moment is generated around the contact support portion 11a of the contact 11. Accordingly, the contact 11 can be supported merely by fitting the contact support portion 11a provided at one location of the contact 11 onto the contact support portion 10a of the housing 10 from above, and there is no need to dispose any special member for supporting the contact 11 in the housing 10. This reduces the spacing at which the contacts 11 are disposed and allows the contact point density of the connector 100 to be increased.

Figure 4A:
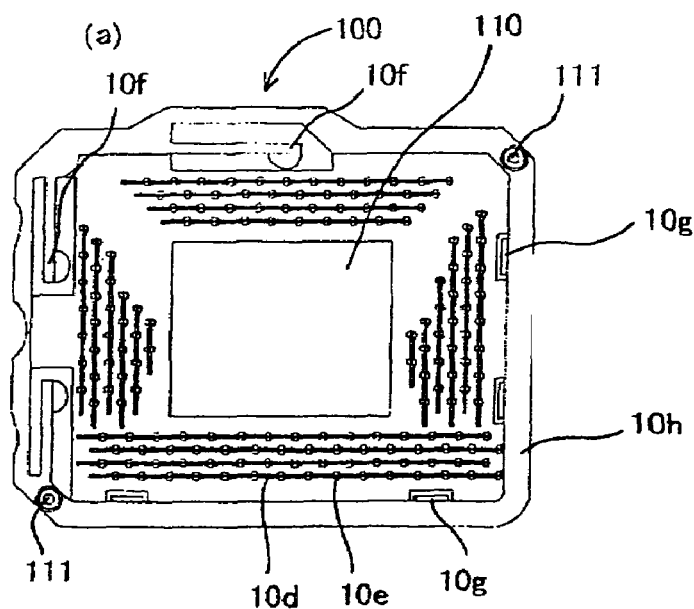
Figure 4B:
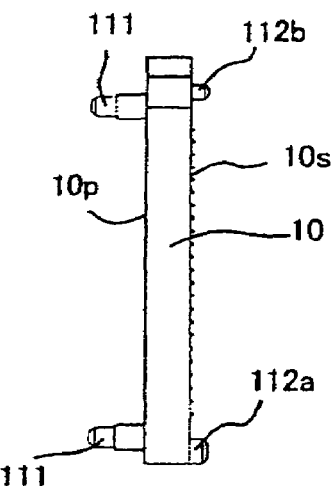
Figure 4C:
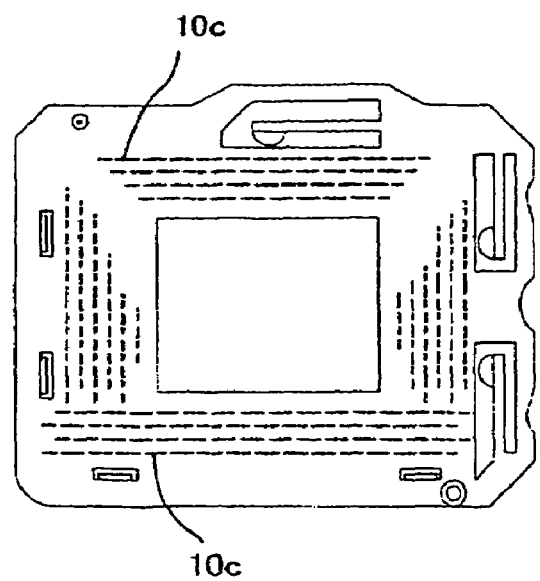

FIGS. 4a–c show an example of the overall structure of the electrical connector 100, which comprises the above-mentioned housing 10 and the contacts 11 wherein FIG. 4a is a top view, FIG. 4b is a side view, and FIG. 4c is a bottom view.

This electrical connector 100 has in the center part of the housing 10 a window 110 that eliminates interference with components mounted on the circuit board. A border 10h is disposed around the outside of the housing 10 so as to constitute a recess for holding LGA packages, which are electrical circuits disposed on the top face. Protrusions 10g and springs 10f are disposed on at least two sides of the border 10h, so as to guide the LGA packages to the specified locations. Also, the housing 10 is equipped with bosses 111 for positioning a heat sink or the like for cooling the LGA packages held on the top face, and bosses 112a and 112b for guiding the connector 100 to its intended position on the circuit board.

A second embodiment of the electrical connector pertaining to the present invention will now be described through reference to FIGS. 5 to 8.

Figure 5:
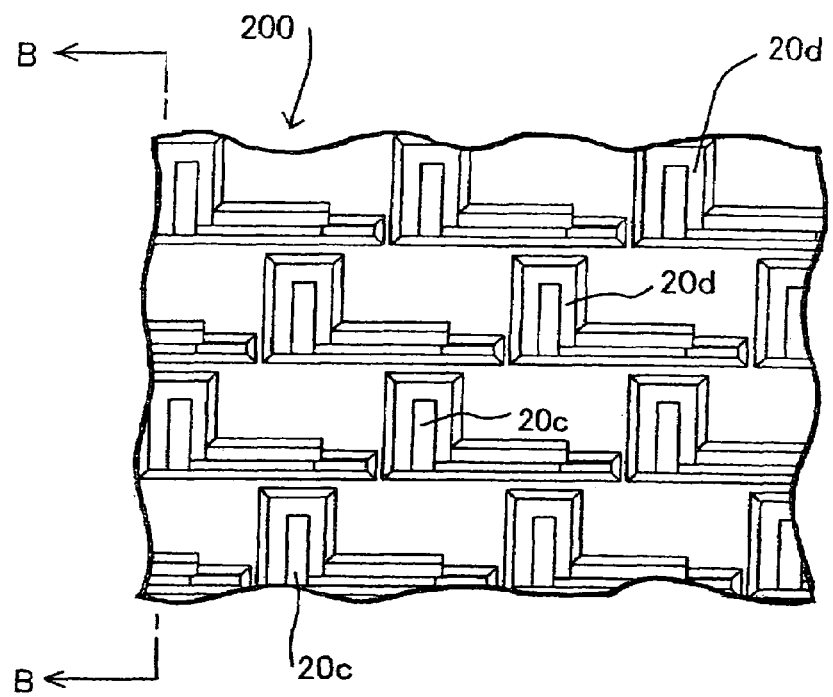
FIG. 5 is a plan view of the second embodiment of the electrical connector pertaining to the present invention.

FIG. 5 is a plan view showing contacts 21 mounted in a housing 20 of an electrical connector 200. Only part of the housing 20 is depicted. Contact holding recesses 20d for holding the contacts 21 are formed on a first face (the upper face in FIG. 5) 20p of the housing 20, and contact support portions 20a (FIG. 7) for supporting the contacts 21 are provided at specific intervals in the contact holding recesses 20d. Contact cavities 20c, in which are disposed the contact portions of the contacts 21, where the contact points of a first electrical circuit are electrically connected via the contacts 11 to the contact points of a second electrical circuit (neither of which are depicted) disposed respectively on the upper face 20p and the lower face 20s of the housing 20, are formed in the upper and lower faces of the housing 20 at specific intervals.

Figure 6A:
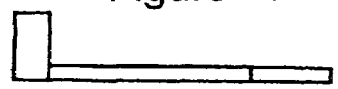
Figure 6C:
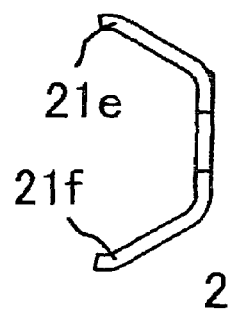
Figure 6B:
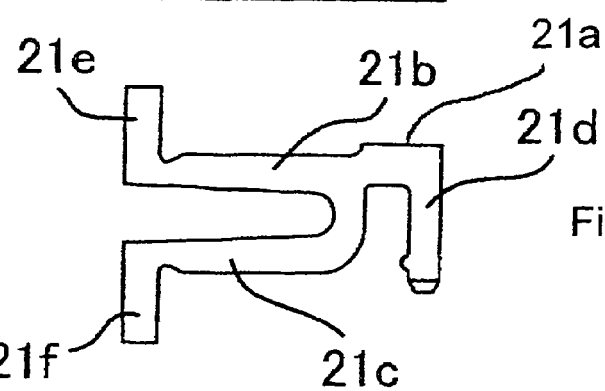

FIGS. 6a–c shows the shape of the contacts 21 mounted in the housing 20 wherein FIG. 6a is a plan view, FIG. 6b is a front view, and FIG. 6c is a left side view. This contact 21 is a member having a press-fit support portion 21a that is press fit to the contact support portion 20a of the insulative housing 20, and two cantilevered beams 21b and 21c extending from the press-fit support portion 21a, wherein the distal ends form a virtual U-shape. The upper beam 21b and the lower beam 21c are formed integrally to create a U-shape via the contact support portion 21a, and the distal ends thereof are bent to form contact portions 21e and 21f that are in contact with the contact point 501 of the first electrical circuit and the contact point 502 of the second electrical circuit, respectively, thereby electrically connecting these to each other. The upper beam 21b and the lower beam 21c of the contact 21 are designed to be able to undergo elastic deformation with respect to the contact support portion 20a. The contact 21 shaped as above can be formed, for example, by stamping a metal sheet with excellent elasticity and electrical conductivity, such as a copper alloy.

Figure 7A:
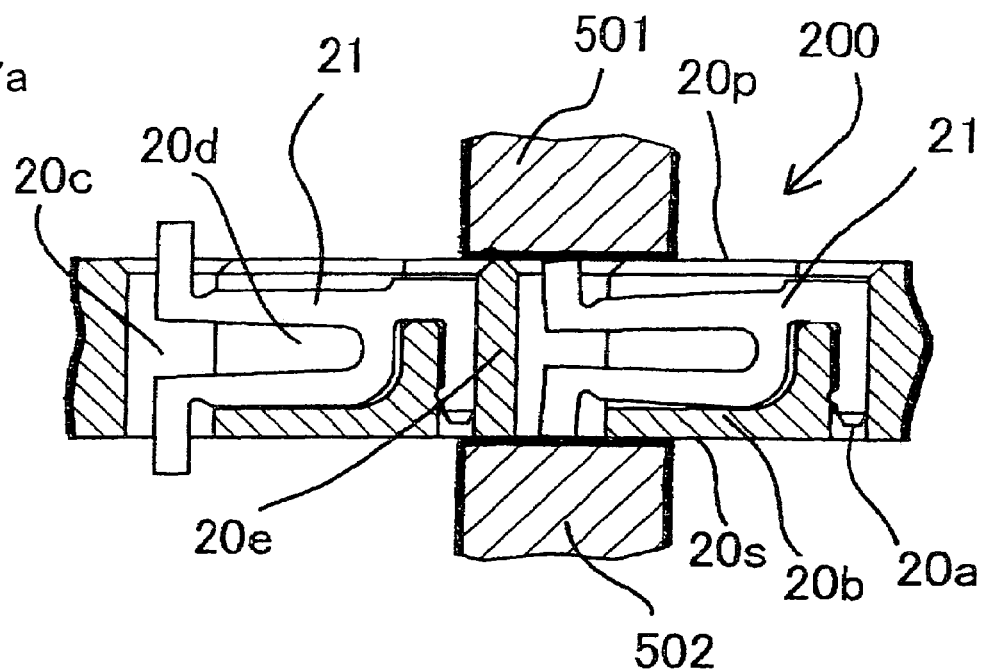
Figure 7B:
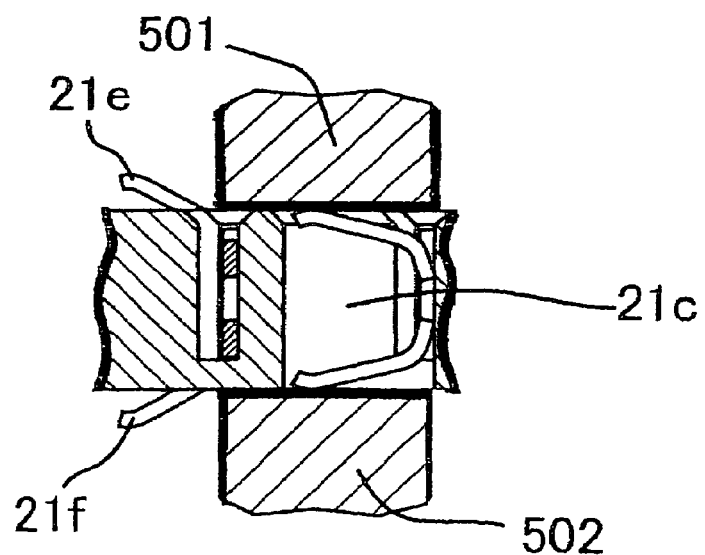

FIGS. 7a–b show cross sections of the contacts 21 mounted in the housing 20 wherein FIG. 7a is a partial cross section in which the housing 20 has been cut in the middle of a contact holding recess 20d in which a contact is disposed, and FIG. 7b is a partial cross section in which the housing 20 has been cut perpendicular to a contact holding recess 20d at the section line B—B of FIG. 5.

When the contact portions 21e and 21f of the contacts 21 are pushed into the housing 20 while being sandwiched between the electrodes 501 and 502 of the electrical circuits disposed vertically in the housing, the upper beam 21b and the lower beam 21c not only bend such that they move closer together around the contact support portions 21a, but also elastically deform while twisting. As a result, the amount of vertical movement of the upper beam 21b and the lower beam 21c of the contact 21 need not be as large as when there is only bending, so the amount of displacement required of the contact portions 21e and 21f can be obtained without having to make the housing 20 thicker. The contact 21 shown on the right side in FIG. 7a is in a state of having undergone elastic deformation while sandwiched between the electrodes 501 and 502.

The bottom 20b of the contact holding recess 20d in contact with the lower beam 21c of the press-fitted and fixed contact 21 is a portion that insulates and protects so that the lower beam 21c does not come into contact with portions other than those intended by being exposed on the lower face 20s of the housing 20, and does not affect the deformation behavior of the contact 21.

Thus, the connector 200 is designed such that the upper beam 21b and lower beam 21c of each contact 21 are substantially symmetrical vertically, so the contact components 21e and 21f are in contact with the electrodes 501 and 502 at substantially equal force. Also, since more displacement can be obtained in the contact portions 21e and 21f, the contacts 11 can be kept in contact with the electrodes 501 and 502 at all times even if the distance between the electrodes 501 and 502 of connected external circuits changes, allowing the electrically connected state to be stably maintained.

Also, each contact 21 is disposed such that the position where the contact portion 21e comes into contact with the electrode 501 at the upper face 20p of the housing 20 overlaps the position where the contact portion 21f comes into contact with the electrode 502 at the lower face 20s of the housing 20, when viewed in the vertical direction. As a result, almost no rotational moment is generated around the press-fit support portion 21a of the contact 21. Accordingly, the contact 21 can be made independent merely by press fitting the press-fit support portion 21a provided at one location of the contact 21 onto the contact support portion 20a of the housing 20 from above. Therefore, there is no need to dispose any special member for supporting the contact 21 in the housing 20. Furthermore, the electrode spacer wall 20e can also be omitted as discussed below. This reduces the spacing at which the contacts 21 are disposed and allows the contact point density of the connector 200 to be increased.

Figure 8A:
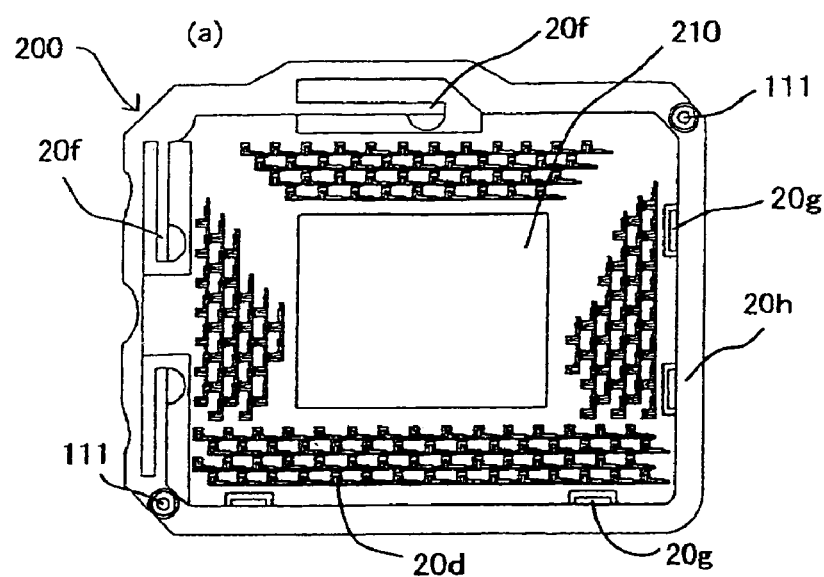
Figure 8B:
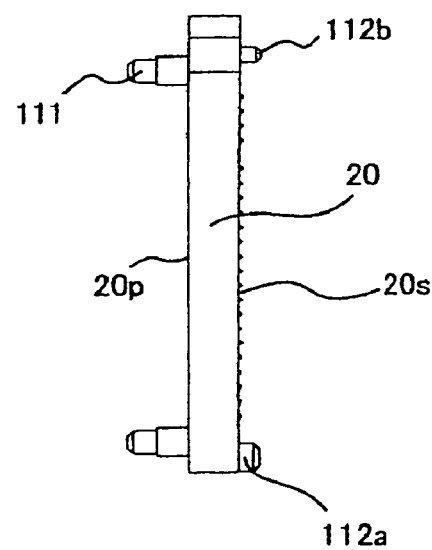
Figure 8C:
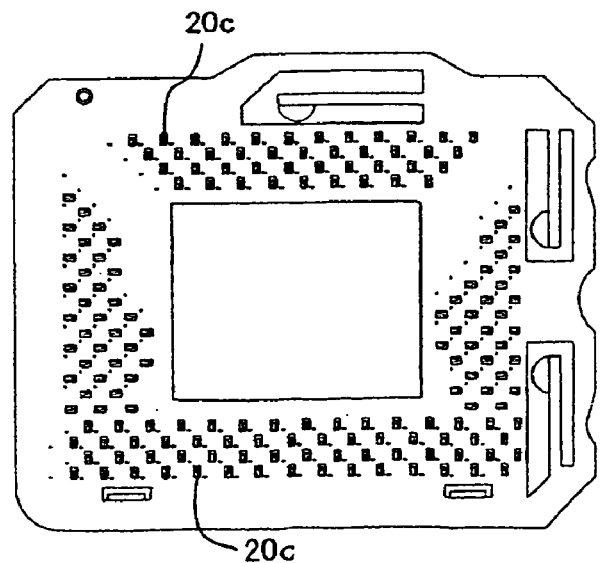

FIGS. 8a–c show an example of the overall structure of the electrical connector 200, which comprises the above-mentioned housing 20 and the contacts 21 wherein FIG. 8a is a top view, FIG. 8b is a side view, and FIG. 8c is a bottom view.

This electrical connector 200 is substantially the same as that of the electrical connector 100 in the first embodiment illustrated in FIG. 4, and has in the center part of the housing 20 a window 210 that eliminates interference with components mounted on the circuit board. A border 20h is disposed around the outside of the housing 20 so as to form a recess for holding LGA packages, which are electrical circuits disposed on the top face. Protrusions 20g and springs 20f are disposed on at least two sides thereof, so as to guide the LGA packages to the specified locations.

A third embodiment of the electrical connector pertaining to the present invention will now be described. This electrical connector is a modification of the electrical connector 200 given as the second embodiment, in which the electrode spacer wall 20e between the various contacts mounted in the housing is omitted.

Figure 9:
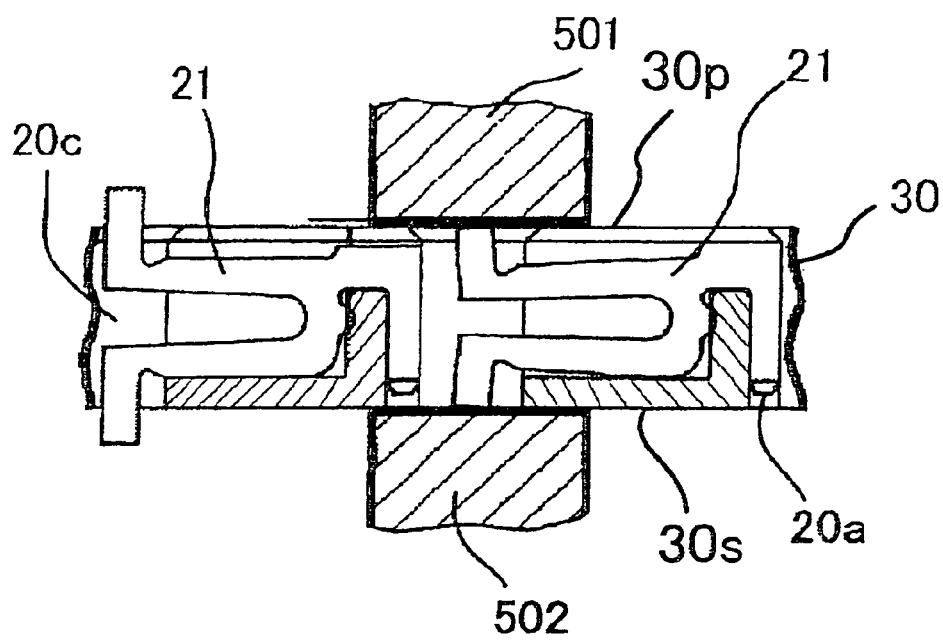
FIG. 9 is a partial cross section of a modified embodiment of the electrical connector shown in FIG. 5.

FIG. 9 is a partial cross section showing the contacts 21 mounted in a housing 30 of this electrical connector, and illustrates an embodiment in which the electrode spacer wall 20e shown in FIG. 7a has been omitted.

As discussed above, each contact 21 is disposed such that the position where the contact portion 21e comes into contact with the electrode 501 at the upper face of the housing overlaps the position where the contact portion 21f comes into contact with the electrode 502 at the lower face of the housing, when viewed in the vertical direction in the contact cavity 20c, so almost no rotational moment is generated around the press-fit support portion 21a of the contact 21. Accordingly, no excessive force is applied to the contact support portion 20a of the housing 20, the structure of the contact support portion can be simplified, and the electrode spacer wall 20e can be omitted. As a result, the contacts 21 can be disposed with less space between them, and the density of the contact points of the connector 300 can be increased.

Since each of the contacts 11, 21 has one portion of the contact supported by the insulative housing 10, 20, 30 so as to be capable of pivoting in response to the displacement of the first contact portion and the second contact portion, an electrical connector 100, 200 with a floating structure can be advantageously obtained using a contact 11, 21 with a simple shape, so there is no impediment to reducing height or raising density.

Another advantage of the invention is that since the first contact portion 11e, 21e and the second contact portion 11f, 21f are capable of elastic displacement within a plane, and the shape of the contact 11, 21 can be therefore flat, it is easier to manufacture and control to the proper size, and an electrical connector in which this contact is used can be made even lower in height, and the density of the contact points can be increased.

Since each of the contacts 11, 21 has one portion of the contact supported by the insulative housing 10, 20, 30, and the first contact portion 11e, 21e that comes into contact with the contact point 501 of the first electrical circuit and the second contact portion that comes into contact with the contact point 502 of the second electrical circuit are capable of elastic displacement through the bending and twisting of this contact, an electrical connector with a large amount of displacement of the contact portions can advantageously be obtained without increasing the height of the connector.

In another advantage of the invention, since each of the contacts 11, 21 comes into contact with the contact point 501 of the first electrical circuit and the contact point 502 of the second electrical circuit at the same location when the first face and second face of the insulative housing are seen in plan view, almost no rotational moment is generated at the contact, and there is no need to securely fix the contact to the housing. Specifically, since the contact 11, 21 only needs to be held to the housing 10, 20, 30 so that it will not fall off, the contact can be supported at one place in a floating state such that it can pivot, and the structure of the support portion is greatly simplified even when the contact is fixed and supported, so contacts can be disposed at higher density.

In another advantage of the invention, since each of the contacts 11, 21 is supported by the insulative housing 10, 20, 30 by being inserted in one direction from the first face 10p, 20p, 30p of the insulative housing toward the second face 10s, 20s, 30s opposite from the first face, mounting the contacts 11, 21 in the housing is easier. Furthermore, since the contact is held directly in the housing, there is no need to dispose any special members such as a lid for holding the contact in the housing, so there is no impediment to lowering the height of the electrical contact.

What is claimed is:

1. An electrical connector, comprising:
   an insulative housing having a first face that faces a first electrical circuit, and a second face that faces a second electrical circuit; and
   a plurality of contacts mounted in the insulative housing, for contacting a plurality of contact points of the first electrical circuit at the first face, and for contacting a plurality of contact points of the second electrical circuit at the second face, thereby interconnecting the first and second electrical circuits,
   wherein each contact is independently fixed to the insulative housing by one portion of the contact, and the first contact portion that contacts the contact point of the first electrical circuit and the second contact portion that contacts the contact point of the second electrical circuit are capable of elastic displacement through the bending and twisting of this contact.

2. The electrical connector according to claim 1, wherein the contact comes into contact with the contact point of the first electrical circuit and the contact point of the second electrical circuit at the same location when the first face and second face of the insulative housing are seen in plan view.

3. The electrical connector according to claim 2, wherein the contact is supported by the insulative housing by being inserted in one direction from the first face of the insulative housing toward the second face opposite from the first face.

* * * * *